US008088248B2

(12) United States Patent
Larson

(10) Patent No.: US 8,088,248 B2
(45) Date of Patent: Jan. 3, 2012

(54) GAS SWITCHING SECTION INCLUDING VALVES HAVING DIFFERENT FLOW COEFFICIENTS FOR GAS DISTRIBUTION SYSTEM

(75) Inventor: Dean J. Larson, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 949 days.

(21) Appl. No.: 11/329,170

(22) Filed: Jan. 11, 2006

(65) Prior Publication Data
US 2007/0158025 A1 Jul. 12, 2007

(51) Int. Cl.
*H01L 21/306* (2006.01)
*C23C 16/00* (2006.01)

(52) U.S. Cl. ......... 156/345.33; 156/345.26; 156/345.34; 118/715

(58) Field of Classification Search .................. 118/715; 156/345.33, 345.34
See application file for complete search history.

(56) References Cited

U.S. PATENT DOCUMENTS

| 4,570,669 | A | * | 2/1986 | Pauliukonis | 137/528 |
| 4,932,232 | A | * | 6/1990 | Ballyns et al. | 72/201 |
| 5,074,522 | A | * | 12/1991 | Reynolds et al. | 251/127 |
| 5,534,751 | A | | 7/1996 | Lenz et al. | |
| 5,989,345 | A | * | 11/1999 | Hatano | 118/715 |
| 6,013,155 | A | | 1/2000 | McMillin et al. | |
| 6,245,192 | B1 | * | 6/2001 | Dhindsa et al. | 156/345.34 |
| 6,270,862 | B1 | | 8/2001 | McMillin et al. | |
| 2001/0003288 | A1 | * | 6/2001 | Clayton et al. | 137/884 |
| 2001/0010257 | A1 | | 8/2001 | Ni et al. | |
| 2002/0192369 | A1 | * | 12/2002 | Morimoto et al. | 427/248.1 |
| 2003/0029567 | A1 | | 2/2003 | Dhindsa et al. | |
| 2003/0070620 | A1 | | 4/2003 | Cooperberg et al. | |
| 2004/0112538 | A1 | * | 6/2004 | Larson et al. | 156/345.33 |
| 2005/0016956 | A1 | * | 1/2005 | Liu et al. | 216/67 |
| 2005/0241763 | A1 | * | 11/2005 | Huang et al. | 156/345.33 |
| 2006/0073276 | A1 | * | 4/2006 | Antonissen | 427/248.1 |
| 2007/0241296 | A1 | * | 10/2007 | Prieto Barranco et al. | 251/29 |
| 2007/0259130 | A1 | * | 11/2007 | Von Kaenel et al. | 427/569 |
| 2008/0107809 | A1 | * | 5/2008 | Wu et al. | 427/248.1 |
| 2008/0210670 | A1 | * | 9/2008 | Brandt et al. | 219/121.55 |

FOREIGN PATENT DOCUMENTS

WO WO 2004/017368 A2 2/2004

OTHER PUBLICATIONS

International Search Report and Written Opinion dated Jul. 16, 2008 for PCT/US07/00035.
Official Action mailed Aug. 26, 2011 for Japanese Patent Appln. No. 2008-550331 (partial translation attached).
International Preliminary Report on Patentability dated Sep. 12, 2008 for PCT/US2007/000035.

* cited by examiner

*Primary Examiner* — Ram Kackar
*Assistant Examiner* — Satish Chandra
(74) *Attorney, Agent, or Firm* — Buchanan Ingersoll & Rooney PC

(57) ABSTRACT

A gas switching system for a gas distribution system for supplying different gas compositions to a chamber, such as a plasma processing chamber of a plasma processing apparatus, is provided. The chamber can include multiple zones, and the gas switching section can supply different gases to the multiple zones. The switching section can switch the flows of one or more gases, such that one gas can be supplied to the chamber while another gas can be supplied to a by-pass line, and then switch the gas flows.

10 Claims, 6 Drawing Sheets

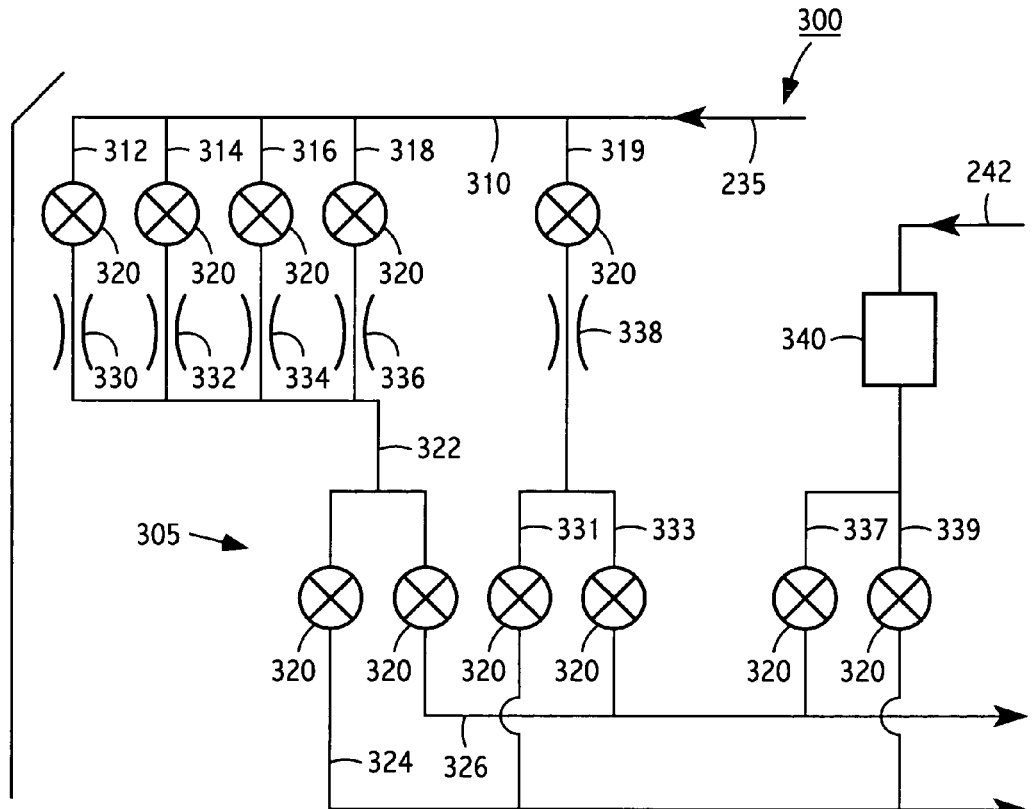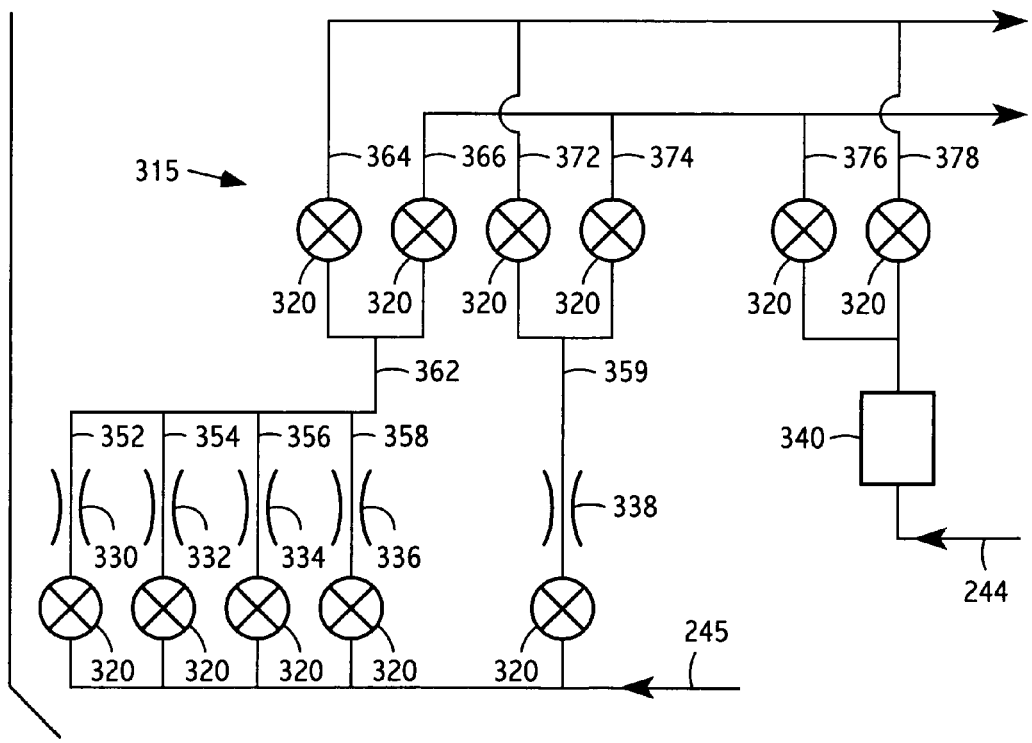
FIG. 4

GAS SWITCHING SECTION INCLUDING VALVES HAVING DIFFERENT FLOW COEFFICIENTS FOR GAS DISTRIBUTION SYSTEM

BACKGROUND

Semiconductor structures are processed in plasma processing apparatuses including a plasma processing chamber, a gas source that supplies process gas into the chamber, and an energy source that produces plasma from the process gas. Semiconductor structures are processed in such apparatuses by techniques including dry etching processes, deposition processes, such as chemical vapor deposition (CVD), physical vapor deposition, or plasma-enhanced chemical vapor deposition (PECVD) of metal, dielectric and semiconductor materials and resist stripping processes. Different process gases are used for these processing techniques, as well as processing different materials of semiconductor structures.

SUMMARY

A gas distribution system operable to supply selected gases to a vacuum chamber, such as a plasma processing chamber, is provided. The gases can be etching gas compositions and/or deposition gas compositions. Embodiments of the gas distribution system have fast gas switching capabilities, thereby allowing the system to change over between different gases supplied to the vacuum chamber within a short period of time. Gas switching can preferably be done without the occurrence of undesirable pressure surges or flow instabilities of either gas. Some embodiments of the gas distribution system can provide selected gas flows, including different gas chemistries and/or flow rates, to different zones of the interior of the vacuum chamber.

An embodiment of a gas switching section for a gas distribution system for supplying process gas to a plasma processing chamber is provided, which comprises a first gas passage adapted to be in fluid communication with a first gas line and the plasma processing chamber; a second gas passage adapted to be in fluid communication with the first gas line and a by-pass line; a first fast switching valve along the first gas passage operable to open and close the first gas passage, the first fast switching valve having a first flow coefficient; and a second fast switching valve along the second gas passage operable to open and close the second gas passage, the second fast switching valve having a second flow coefficient different than the first flow coefficient such that an inlet pressure of the first fast switching valve is substantially equal to an inlet pressure of the second fast switching valve when gas flow is switched from the first gas passage to the second gas passage by closing the first fast switching valve and opening the second fast switching valve, or from the second gas passage to the first gas passage by closing the second gas passage and opening the first gas passage.

Another embodiment of the gas switching section for a gas distribution system for supplying gas to a plasma processing chamber including a gas distribution member having center and edge zones which are flow insulated from each other is provided. The gas switching system comprises a first gas passage adapted to be in fluid communication with a first gas line and the edge zone of the gas distribution member of the plasma processing chamber; a second gas passage adapted to be in fluid communication with the first gas line and a by-pass line; a third gas passage adapted to be in fluid communication with a second gas line and the center zone of the gas distribution member; a fourth gas passage adapted to be in fluid communication with the second gas line and the by-pass line; a fifth gas passage adapted to be in fluid communication with a third gas line and the center zone; a sixth gas passage adapted to be in fluid communication with the third gas line and the by-pass line; a seventh gas passage adapted to be in fluid communication with a fourth gas line and the edge zone; an eighth gas passage adapted to be in fluid communication with the fourth gas line and the by-pass line; first and second fast switching valves along the first and second gas passages respectively, the first fast switching valve is operable to open and close the first gas passage and having a first flow coefficient, the second fast switching valve is operable to open and close the second gas passage and has a second flow coefficient different than the first flow coefficient such that an inlet pressure of the first fast switching valve is substantially equal to an inlet pressure of the second fast switching valve when gas flow is switched from the first gas passage to the second gas passage or from the second gas passage to the first gas passage; third and fourth fast switching valves along the third and fourth gas passages, respectively, the third fast switching valve is operable to open and close the third gas passage and has a third flow coefficient, the fourth fast switching valve is operable to open and close the fourth gas passage and has a fourth flow coefficient different than the third flow coefficient such that an inlet pressure of the third fast switching valve is substantially equal to an inlet pressure of the fourth fast switching valve when gas flow is switched from the third gas passage to the fourth gas passage or from the fourth gas passage to the third gas passage; fifth and sixth fast switching valves along the fifth and sixth gas passages, respectively, the fifth fast switching valve is operable to open and close the first gas passage and has a fifth flow coefficient, the sixth fast switching valve is operable to open and close the sixth gas passage and has a sixth flow coefficient different than the fifth flow coefficient such that an inlet pressure of the fifth fast switching valve is substantially equal to an inlet pressure of the sixth fast switching valve when gas flow is switched from the fifth gas passage to the sixth gas passage or from the sixth gas passage to the fifth gas passage; and seventh and eighth fast switching valves along the seventh and eighth gas passages respectively, the seventh fast switching valve is operable to open and close the seventh gas passage and has a seventh flow coefficient, the eighth fast switching valve is operable to open and close the eighth gas passage and has an eighth flow coefficient different than the seventh flow coefficient such that an inlet pressure of the eighth fast switching valve is substantially equal to an inlet pressure of the seventh fast switching valve when gas flow is switched from the seventh gas passage to the eighth gas passage or from the eighth gas passage to the seventh gas passage.

A method of processing a semiconductor substrate in a plasma processing chamber comprising a showerhead electrode including center and edge zones is provided. An embodiment of the method comprises a) supplying a first process gas to the center and edge zones of the showerhead electrode assembly while diverting a second process gas to a by-pass-line, where the plasma processing chamber contains a semiconductor substrate including at least one layer and a patterned resist mask overlying the layer; b) producing a first plasma from a first process gas and (i) etching at least one feature in the layer or (ii) forming a polymer deposit on the mask; c) switching the flows of the first and second process gases so that the second process gas is supplied to the center and edge zones of the showerhead electrode assembly while the first process gas is diverted to the by-pass line; d) producing a second plasma from the second process gas and (iii) etching the at least one feature in the layer or (iv) forming a polymer deposit on the layer and the mask; e) switching the flows of the first and second process gases so that the first process gas is supplied into the plasma processing chamber while diverting the second process gas to the by-pass line; and f) repeating a)-e) a plurality of times with the substrate.

A method of making a gas switching section for a gas distribution system for supplying process gas to a plasma processing chamber is also provided. An embodiment of the method comprises arranging a first fast switching valve along a first gas passage adapted to be in fluid communication with a first gas line and the plasma processing chamber; arranging a second fast switching valve along a second gas passage adapted to be in fluid communication with the first gas line and a by-pass line; and adjusting a first flow coefficient of the first fast switching valve and/or adjusting a second flow coefficient of the second fast switching valve such that the first and second flow coefficients are different from each and an inlet pressure of the first fast switching valve is substantially equal to an inlet pressure of the second fast switching valve when a gas flow is switched from the first gas passage to the second gas passage or from the second gas passage to the first gas passage.

BRIEF DESCRIPTION OF THE DRAWING FIGURES

FIG. 1 is a sectional view of an exemplary embodiment of a plasma processing apparatus that preferred embodiments of the gas distribution system can be used with.

FIG. 4 depicts a preferred embodiment of a flow control section of the gas distribution system.

DETAILED DESCRIPTION

Figure 1:
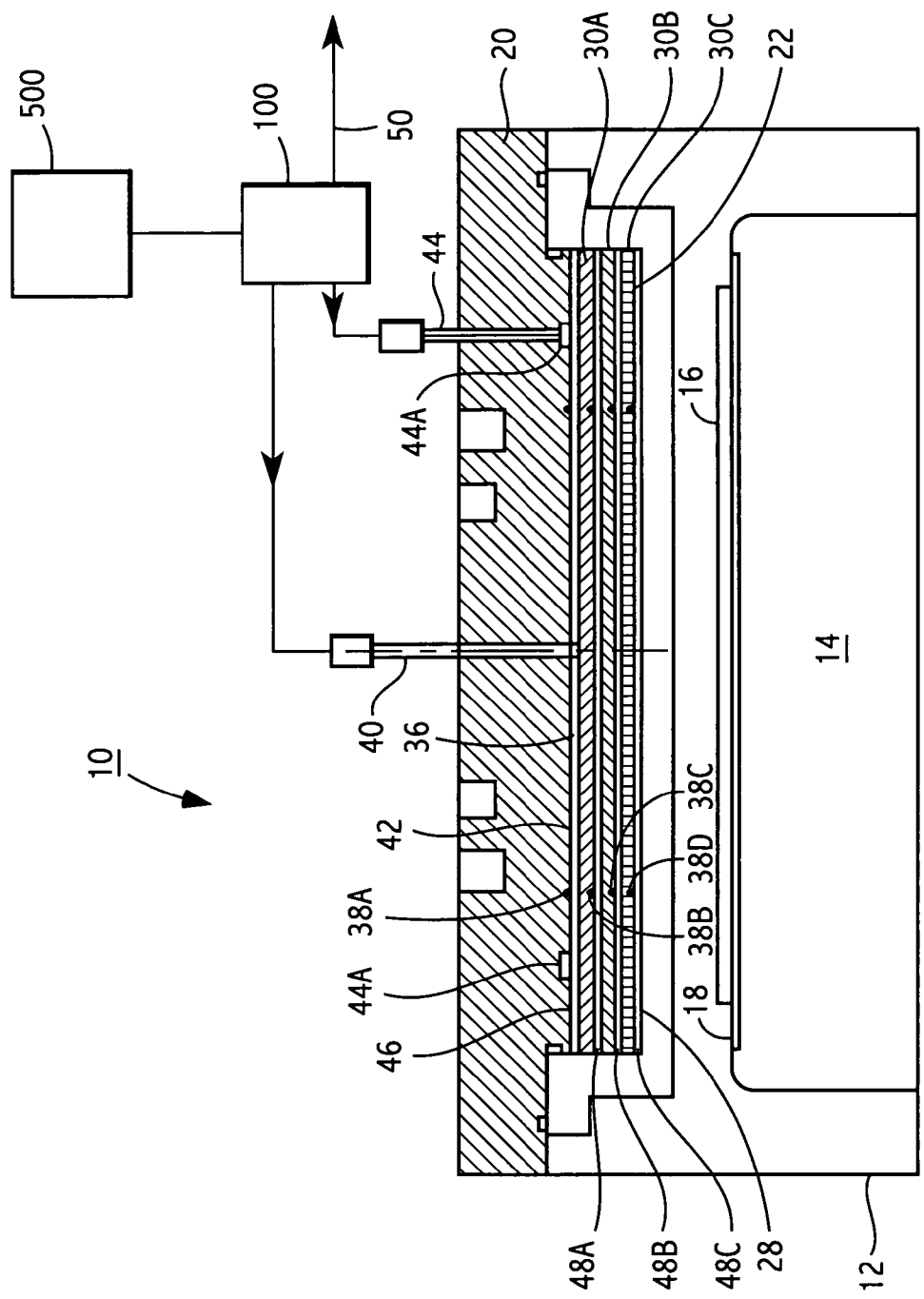

Plasma processing apparatuses for processing semiconductor materials, such as semiconductor devices formed on semiconductor substrates, e.g., silicon wafers, include a plasma processing chamber and a gas distribution system that supplies process gas into the plasma processing chamber. The gas distribution system can distribute gas to a single region (or zone) or to multiple regions (or zones) across the surface of a substrate during plasma processing. The gas distribution system can include flow controllers to control the flow ratio of the same process gas or different process gases, or the same or different gas mixture, to the zones, thereby allowing in-process adjustment of across-substrate uniformity of gas flow and gas composition.

Although multiple-zone gas distribution systems can provide improved flow control as compared to a single-zone system, it may be desirable to provide such multiple-zone systems with an arrangement that allows substrate processing operations in which the gas composition and/or the gas flow can be changed within a short period of time.

A gas distribution system is provided for supplying different gas compositions and/or flow ratios to a chamber. In a preferred embodiment, the gas distribution system is adapted to be in fluid communication with an interior of a vacuum chamber, such as a plasma processing chamber of a plasma processing apparatus, and provide the capability of supplying different gas chemistries and/or gas flow rates to the vacuum chamber during processing operations. The plasma processing apparatus can be a low-density, medium-density or high-density plasma reactor including an energy source that uses RF energy, microwave energy, magnetic fields, or the like to produce plasma. For example, the high-density plasma can be produced in a transformer coupled plasma (TCP™) reactor, also known as an inductively coupled plasma reactor, an electron-cyclotron resonance (ECR) plasma reactor, a capacitive-type discharge reactor, or the like. Exemplary plasma reactors that embodiments of the gas distribution system can be used with include Exelan™ plasma reactors, such as the 2300 Excelan™ plasma reactor, available from Lam Research Corporation, located in Fremont, Calif. During plasma etching processes, multiple frequencies can be applied to a substrate support incorporating an electrode and an electrostatic chuck. Alternatively, in dual-frequency plasma reactors, different frequencies can be applied to the substrate support and an electrode, such as a showerhead electrode, spaced from the substrate so as to define a plasma generation region.

A preferred embodiment of the gas distribution system can supply a first gas into the interior of a vacuum chamber, such as a plasma processing chamber, via a single zone or multiple zones, preferably at least a center and edge zone of a gas distribution member adjacent to an exposed surface of a substrate to be processed. The center and edge zones are radially spaced, and preferably flow insulated, from each other in the plasma processing chamber. The gas distribution system can simultaneously divert a second gas that is different from the first gas to a vacuum chamber by-pass line. The by-pass line can be in fluid communication with a vacuum pump, or the like. In a preferred embodiment, the first gas is a first process gas and the second gas is a different process gas. For example, the first gas can be an etch gas chemistry or deposition gas chemistry, and the second gas can be a different etch gas chemistry or deposition gas chemistry. The gas distribution system can simultaneously provide different controlled flow rates of the first gas to the center and edge zones, respectively, while the second gas is diverted to the by-pass line, and vice versa. By diverting one of the gases to the by-pass line, change over of the gas supplied to the vacuum chamber can be achieved within a short period of time.

The gas distribution system includes switching devices that allow gas switching, or gas change over, in a short period of time between first and second gases supplied to an interior of a vacuum chamber that includes a single zone or multiple zones. For multiple-zone systems, the gas distribution system can supply the first gas to the center and edge zones while the second gas is diverted to the by-pass line, and then switch the gas distributions within a short period of time so that the second gas is supplied to the center and edge zones while the first gas is diverted to the by-pass line. The gas distribution system can alternately supply the first and second gases into the interior of the vacuum chamber, each for a desired period of time to allow quick change over between different processing operations that use different gas chemistries, e.g., alternating steps of a method of processing a semiconductor device. In a preferred embodiment, the method steps can be different etch steps, e.g., pulsed etching and deposition steps, a faster etch step, such as a main etch, and a relatively slower etch step, such as an over etch step; an etch step and a material deposition step; or different material deposition steps that deposit different materials onto a substrate.

In a preferred embodiment of the gas distribution system, a volume of a gas composition in a confined region within a vacuum chamber, preferably a plasma confinement zone, can be replaced (i.e., flushed out) by another gas composition introduced into the vacuum chamber within a short period of time. Such gas replacement preferably can be achieved in less than about 1 s, more preferably within less than about 200 ms, by providing valves having a fast switching capability in the gas distribution system. The plasma confinement zone can have a gas volume of about ½ liter to about 4 liters for a plasma processing chamber for processing 200 mm or 300 mm wafers. The plasma confinement zone can be defined by a stack of confinement rings, such as disclosed in commonly-owned U.S. Pat. No. 5,534,751, which is hereby incorporated by reference in its entirety.

FIG. 1 depicts an exemplary semiconductor material plasma processing apparatus 10 that embodiments of the gas distribution system 100 can be used with. The apparatus 10 comprises a vacuum chamber or plasma processing chamber 12 having an interior containing a substrate support 14 on which a substrate 16 is supported during plasma processing. The substrate support 14 includes a clamping device, preferably an electrostatic chuck 18, which is operable to clamp the substrate 16 on the substrate support 14 during processing. The substrate can be surrounded by focus rings and/or edge rings, ground extensions or other parts, such as parts disclosed in commonly-owned U.S. Patent Application Publication No. US 2003/0029567, which is incorporated herein by reference in its entirety.

In a preferred embodiment, the plasma processing chamber 12 includes a plasma confinement zone having a volume of about ½ liter to about 4 liters, preferably about 1 liter to about 3 liters, for processing 200 mm or 300 mm wafers. For example, the plasma processing chamber 12 can include a confinement ring arrangement, such as disclosed in commonly-owned U.S. Pat. No. 5,534,751, to define the plasma confinement zone. The gas distribution system can replace such a volume of gas in the plasma confinement zone with another gas within a period of less than about 1 s, preferably in less than about 200 ms, without substantial back diffusion. The confinement mechanism can limit the fluid communication from the plasma volume to portions of the interior of the plasma processing chamber 12 that are outside of the plasma volume.

The substrate 16 may include a base material, such as a silicon wafer; an intermediate layer of a material that is to be processed, e.g., etched, over the base material; and a masking layer over the intermediate layer. The intermediate layer may be of a conductive, dielectric or semiconductive material. The masking layer can be patterned photoresist material having an opening pattern for etching desired features, e.g., holes, vias and/or trenches, in the intermediate layer and/or one or more other layers. The substrate can include additional layers of conductive, dielectric or semiconductive materials between the base layer and the masking layer, depending on the type of semiconductor device formed on the base material.

Exemplary dielectric materials that can be processed are, for example, doped silicon oxide, such as fluorinated silicon oxide; un-doped silicon oxide, such as silicon dioxide; spin-on glass; silicate glasses; doped or un-doped thermal silicon oxide; and doped or un-doped TEOS deposited silicon oxide. The dielectric material can be a low-k material having a selected k value. Such dielectric materials can overlie a conductive or semiconductive layer, such as polycrystalline silicon; metals, such as aluminum, copper, titanium, tungsten, molybdenum and their alloys; nitrides, such as titanium nitride; and metal silicides, such as titanium silicide, tungsten silicide and molybdenum silicide.

The exemplary plasma processing apparatus 10 shown in FIG. 1 includes a showerhead electrode assembly having a support plate 20 forming a wall of the plasma chamber, and a showerhead 22 attached to the support plate. A baffle assembly is located between the showerhead 22 and the support plate 20 to uniformly distribute process gas to a backside 28 of the showerhead. The baffle assembly can include one or more baffle plates. In the embodiment, the baffle assembly includes baffle plates 30A, 30B and 30C. Open plenums 48A, 48B and 48C are defined between the baffle plates 30A, 30B and 30C; and between the baffle plate 30C and showerhead 22. The baffle plates 30A, 30B and 30C and showerhead 22 include through passages for flowing process gas into the interior of plasma processing chamber 12.

In the embodiment, the plenum between the plate 20 and the baffle plate 30A and the plenums 48A, 48B and 48C between the baffle plates 30A, 30B and 30C are divided into a center zone 42 and an edge zone 46 by seals 38A, 38B, 38C and 38D, such as O-rings. The center zone 42 and edge zone 46 can be supplied process gas having different respective gas chemistries and/or flow rates by the gas distribution system 100, preferably under control of a controller 500. Gas is supplied from an center zone gas supply 40 into the center zone 42, and gas is supplied from an edge zone gas supply 44 into an annular channel 44a and then into the edge zone 46. The process gas flows through the passages in the baffle plates 30A, 30B and 30C and the showerhead 22 and into the interior of the plasma processing chamber 12. The process gas is energized into the plasma state in the plasma processing chamber 12 by a power source, such as an RF source driving electrode 22, or a power source driving an electrode in the substrate support 14. The RF power applied to the electrode 22 can be varied when different gas compositions are supplied into the plasma processing chamber 12, preferably within a time period of less than about 1 s, more preferably less than about 200 ms.

In other preferred embodiments, the plasma processing apparatus 10 can include a gas injector system for injecting process gas into the plasma processing chamber. For example, the gas injector system can have a configuration as disclosed in commonly-owned U.S. Patent Application Pub. No. 2001/0010257, U.S. Patent Application Pub. No. 2003/0070620, U.S. Pat. No. 6,013,155, or U.S. Pat. No. 6,270,862, each of which is incorporated herein by reference in its entirety. The gas injector system can include injectors that supply process gas to different zones of a plasma processing chamber.

Figure 2:
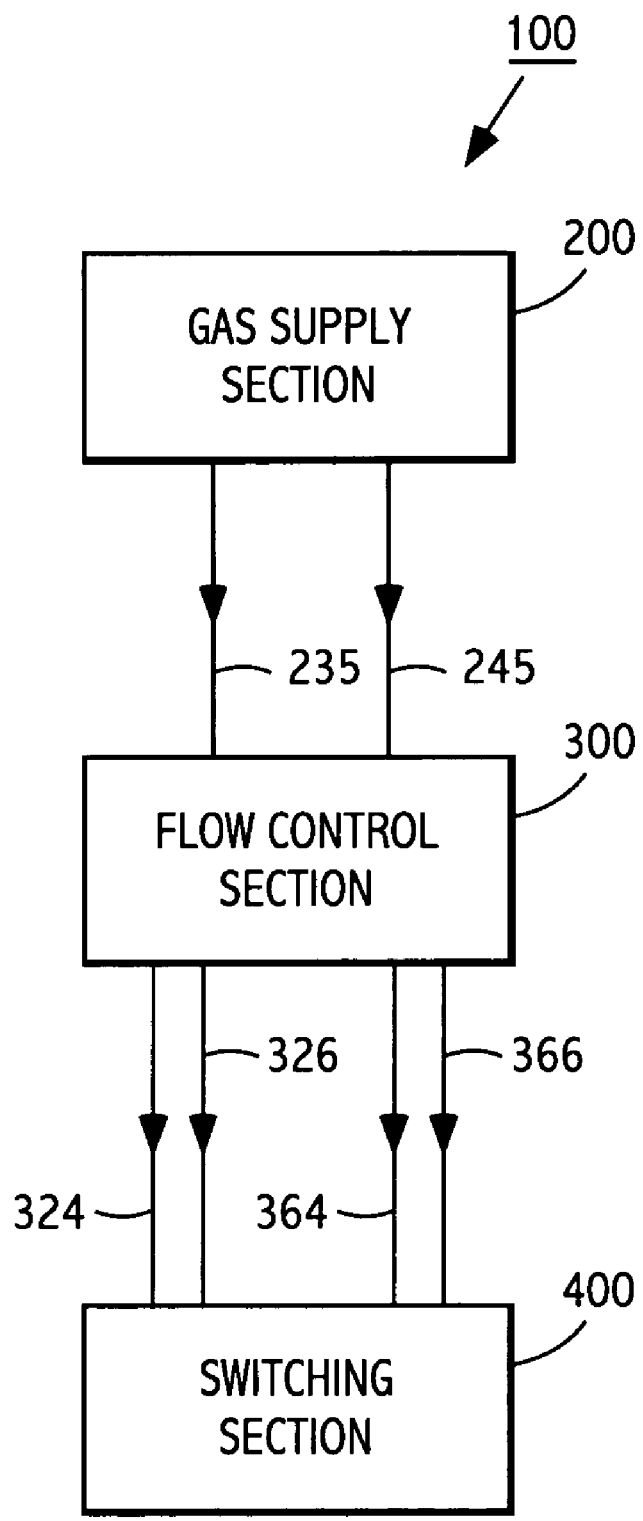
FIG. 2 illustrates a preferred embodiment of the gas distribution system.

FIG. 2 shows a preferred embodiment in which the gas distribution system 100 includes a gas supply section 200, a flow control section 300, and a gas switching section 400 in fluid communication with each other. The gas distribution system 100 preferably also includes a controller 500 (FIG. 1), which is connected in control communication to control operation of the gas supply section 200, flow control section 300 and gas switching section 400.

In the gas distribution system 100, the gas supply section 200 can supply different gases, such as first and second process gases, to the flow control section 300 via respective first and second gas lines 235, 245. The first and second gases can have different compositions and/or gas flow rates from each other.

The flow control section 300 is operable to control the flow rate, and optionally also to adjust the composition, of different gases that can be supplied to the switching section 400. The flow control section 300 can provide different flow rates and/or chemistries of the first and second gases to the switching section 400 via gas passages 324, 326 and 364, 366, respectively. In addition, the flow rate and/or chemistry of the first gas and/or second gas that is supplied to the plasma processing chamber 12 (while the other gas is diverted to by-pass line 50, which can be in fluid communication with a vacuum pumping system, such as between a turbo pump and a roughing pump) can be different for the center zone 42 and the edge zone 46. Accordingly, the flow control section 300 can provide desired gas flows and/or gas chemistries across the substrate 16, thereby enhancing substrate processing uniformity.

In the gas distribution system 100, the switching section 400 is operable to switch from the first gas to the second gas within a short period of time to allow the first gas to be replaced by the second gas in a single zone or multiple zones, e.g., the center zone 42 and the edge zone 46, while simultaneously diverting the first gas to the by-pass line, or vice versa. The gas switching section 400 preferably can switch between the first and second gases without the occurrence of undesirable pressure surges and flow instabilities in the flow of either gas. If desired, the gas distribution system 100 can maintain a substantially constant sequential volumetric flow rate of the first and second gases through the plasma processing chamber 12.

Figure 3:
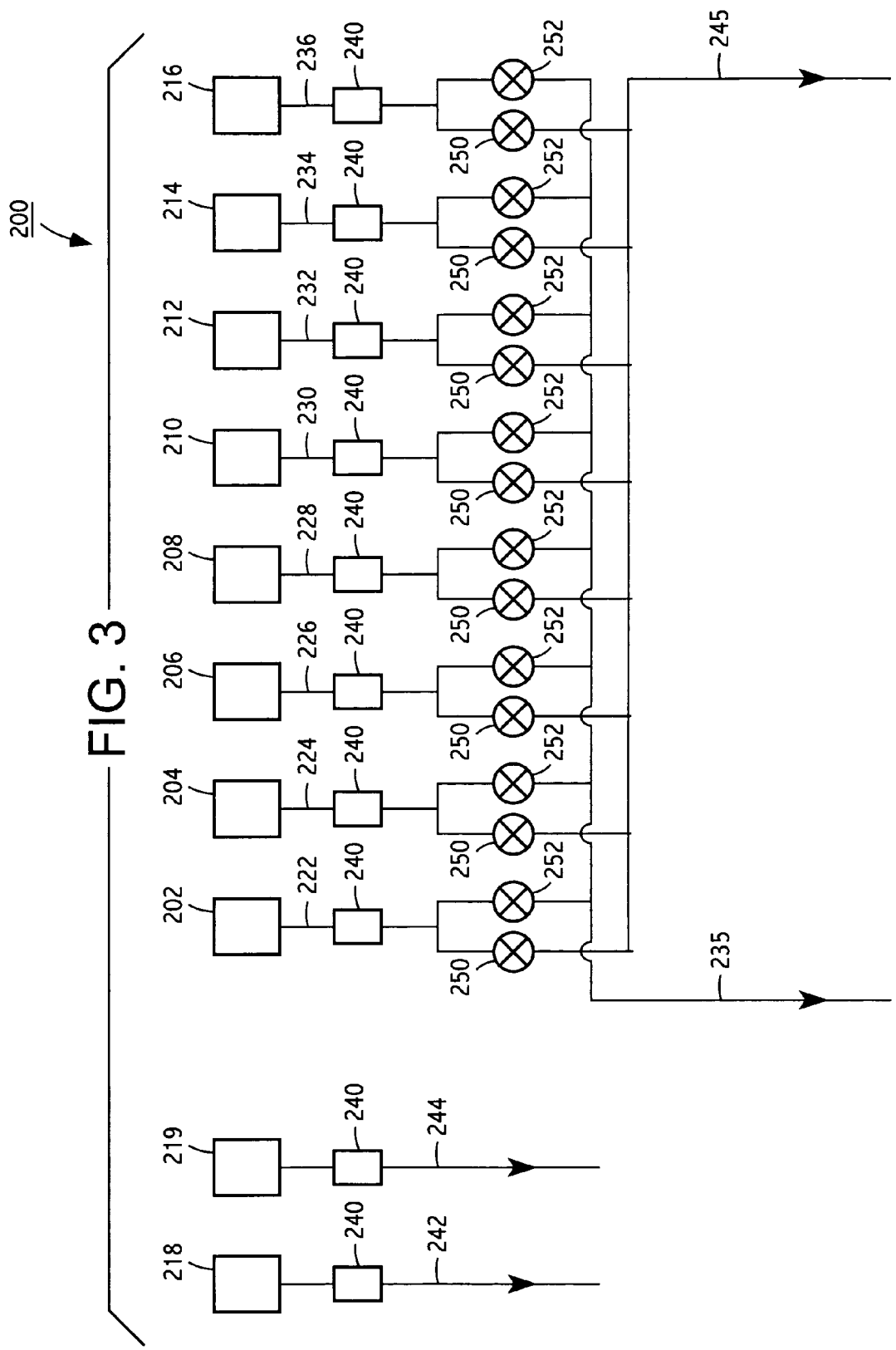
FIG. 3 depicts a preferred embodiment of a gas supply section of the gas distribution system.

FIG. 3 shows a preferred embodiment of the gas supply section 200 of the gas distribution system 100. The gas supply section 200 depicted in FIG. 3 is described in commonly-owned U.S. Application Pub. No. 2005/0241763, which is incorporated herein by reference in its entirety. The gas supply section 200 is preferably connected to the controller 500 to control operation of flow control components, such as valves and flow controllers, to allow control of the composition of two or more gases that can be supplied by the gas supply section 200. In the embodiment, the gas supply section 200 includes multiple gas sources 202, 204, 206, 208, 210, 212, 214 and 216, each being in fluid communication with the first gas line 235 and the second gas line 245. As such, the gas supply section 200 can supply many different desired gas mixtures to the plasma processing chamber 12. The number of gas sources included in the gas distribution system 100 is not limited to any particular number of gas sources, but preferably includes at least two different gas sources. The gas supply section 200 can include more than or less than the eight gas sources included in the embodiment shown in FIG. 3. For example, the gas supply section 200 can include two, three, four, five, ten, twelve, sixteen, or more gas sources. The different gases that can be provided by the respective gas sources include individual gases, such as $O_2$, Ar, $H_2$, $Cl_2$, $N_2$ and the like, as well as gaseous fluorocarbon and/or fluorohydrocarbon compounds, such as $CF_4$, $CH_3F$ and the like. In one preferred embodiment, the plasma processing chamber is an etch chamber and the gas sources 202-216 can supply Ar, $O_2$, $N_2$, $Cl_2$, $CH_3$, $CF_4$, $C_4F_8$ and $CH_3F$ or $CHF_3$ (in any suitable order thereof. The particular gases supplied by the respective gas sources 202-216 can be selected based on the desired process that is to be performed in the plasma processing chamber 12, e.g., a particular dry etching and/or material deposition process. The gas supply section 200 can provide broad versatility regarding the choice of gases that can be supplied for performing etching processes and/or material deposition processes.

The gas supply section 200 preferably also includes at least one tuning gas source to adjust the gas composition. The tuning gas can be, e.g., $O_2$, an inert gas, such as argon, or a reactive gas, such as a fluorocarbon or fluorohydrocarbon gas, e.g., $C_4F_8$. In the embodiment shown in FIG. 3, the gas supply section 200 includes a first tuning gas source 218 and a second tuning gas source 219. As described below, the first tuning gas source 218 and second tuning gas source 219 can supply tuning gas to adjust the composition of the first and/or second gas supplied to the gas switching section 400.

In the embodiment of the gas supply section 200 shown in FIG. 3, a flow control device 240 preferably is disposed in each of the gas passages 222, 224, 226, 228, 230, 232, 234 and 236 in fluid communication with the gas sources 202, 204, 206, 208, 210, 212, 214 and 216, respectively, and also in the gas passages 242, 244 in fluid communication with the first tuning gas source 218 and the second tuning gas source 219, respectively. The flow control devices 240 are operable to control the flow of the gas supplied by the associated gas sources 202-216 and 218, 219. The flow control devices 240 preferably are mass flow controllers (MFCs).

In the embodiment shown in FIG. 3, valves 250, 252 are located along the gas passages downstream of each of the gas sources 202-216. The valves 250, 252 can be selectively opened or closed, preferably under control of the controller 500, to allow different gas mixtures to be flowed to the first gas line 235 and/or the second gas line 245. For example, by opening the valves 252 associated with one or more of the gas sources 202-216 (while the remaining valves 252 associated with the other ones of the gas sources 202-216 are closed), a first gas mixture can be supplied to the first gas line 235. Likewise, by opening the valves 250 associated with one or more of the other gas sources 202-216 (while the remaining valves 250 associated with the other ones of the gas sources 202-216 are closed), a second gas mixture can be supplied to the second gas line 245. Accordingly, various mixtures and mass flow rates of the first and second gases can be provided to the first gas line 235 and the second gas line 245 by controlled operation of the gas supply section 200.

In a preferred embodiment, the gas supply section 200 is operable to provide a continuous flow of the first and second gases via the first gas line 235 and the second gas line 245, respectively. The first gas or the second gas is flowed to the plasma processing chamber 12 while the other gas is diverted to the by-pass line. The by-pass line can be connected to a vacuum pump, or the like. By continuously flowing both of the first and second gases, the gas distribution system 100 can achieve rapid change over of the process gas supplied into the plasma processing chamber.

FIG. 4 shows a preferred embodiment of the flow control section 300 of the gas distribution system 100. The flow control section 300 depicted in FIG. 4 is described in commonly-owned U.S. application Ser. No. 10/835,175. The flow control section 300 includes a first flow control section 305 in fluid communication with the first gas line 235 from the gas supply section 200, and a second flow control section 315 in fluid communication with the second gas line 245 from the gas supply section 200. The flow control section 300 is operable to control the ratio of the first gas supplied to the center zone 42 and edge zone 46, respectively, while the second gas is diverted to the by-pass line, and to control the ratio of the second gas supplied to the center zone 42 and edge zone 46, respectively, while the first gas is diverted to the by-pass line. The first flow control section 305 divides the flow of the first gas introduced at the first gas line 235 into two separate outlet flows of the first gas, and the second flow control section 315 divides the flow of the second gas introduced at the second gas line 245 into two separate outlet flows of the second gas. The first flow control section 305 includes first and second gas passages 324, 326 in fluid communication with the center zone 42 and edge zone 46, respectively, via the switching system 400, and the second flow control section 315 includes first and second gas passages 364, 366 in fluid communication with the center zone 42 and edge zone 46, respectively, via the switching system 400.

In a preferred arrangement, each of the first flow control section 305 and the second flow control section 315 includes at least two flow restrictors. Each flow restrictor preferably has a fixed restriction size for gas flow through it. The flow restrictors are preferably orifices. The flow restrictors restrict gas flow and maintain an approximately constant gas pressure in a region of the gas passages upstream of and proximate the orifices. Each of the first flow control section 305 and the second flow control section 315 preferably includes a network of orifices, e.g., two, three, four, five or more orifices, each preferably having a different cross-sectional restriction size, e.g., a different diameter or a different cross-sectional area. The restriction sizes of the orifices are smaller than the cross-sectional areas of the other portions of the gas flow path of the gas distribution system 100. The orifices are preferably sonic orifices. The gas flows are preferably operated at the critical flow regime in the flow control section 300 so that the flow conductance of a given orifice is determined solely by its restriction size and the inlet gas pressure. As the flow conductance of an orifice increases, the pressure drop across the orifice to achieve a given flow rate through the orifice decreases.

In the embodiment shown in FIG. 4, the first and second flow control sections 305, 315 each include five orifices 330, 332, 334, 336 and 338. For example, the orifices 330, 332, 334, 336 and 338 can have relative restriction sizes, e.g., diameters, of one, one and one half, two, three and three, respectively. Accordingly, when gas flow occurs through the last two orifices 336 and 338, these orifices have approximately the same total conductance. Alternatively, up to all four of the orifices 330-336 can be opened to provide different ratios of the total conductance of the orifices 330-336 as compared to the conductance of the orifice 338, in order to supply different ratios of the first gas flow and the second gas flow to the center zone 42 and the edge zone 46. For flow control section 305, valves 320 in fluid communication with gas passages 324, 326, 331 and 333, doubles the number of possible ratios of the first gas flow and the second gas flow to the center zone 42 and the edge zone 46, thereby reducing the number of orifices 330-338 needed in the system. Flow control section 315 has the same feature to thereby reduce the number of orifices 330-338 needed in the system.

Another embodiment can include a different number of orifices, e.g., a total of two orifices; including the orifice 338 and a second orifice that replaces the multiple orifices 330-336. For example, the second orifice can have the same restriction size as the orifice 338. In such embodiment, the flow ratio of the first gas and/or second gas supplied to the center zone 42 and the edge zone 46 is approximately 1:1.

Valves 320 preferably are located upstream of each of the respective orifices 330-338 to control the flow of the first and second gases to the orifices. For example, in the first flow control section 305 and/or the second flow control section 315, one or more of the valves 320 can be opened to allow flow of the first gas and/or second gas to one or more of the associated orifice(s) 330-336, while the other valve 320 is opened to allow flow of the first gas and/or the second gas to the orifice(s) 338.

In the first flow control section 305, the orifices 330-336 are in fluid communication with the gas passage 322. The gas passage 322 is divided into the first and second gas passages 324, 326, which are in fluid communication with the gas switching section. A pair of valves 320 is located in the first and second gas passages 324, 326 to control flow of the first gas flowed through one or more of the orifices 330-336 of the first flow control section 305 to the center zone 42 and/or the edge zone 46. In an alternative embodiment, the pair of valves 320 located along the gas passages 324, 326 can be replaced by a single, four-way valve.

In the first flow control section 305, the orifice 338 is arranged along the gas passage 319. The gas passage 319 is divided into gas passages 331, 333, which are in fluid communication with the first and second gas passages 324, 326, respectively. A pair of valves 320 is located in the gas passages 331, 333 to control flow of the first gas flowed through the orifice 338 to the first and second gas passages 324, 326. In an alternative embodiment, the pair of valves 320 located along the gas passages 331, 333 can be replaced by a single, four-way valve.

In the second flow control section 315, a pair of valves 320 is located along the first and second gas passages 364, 366 to control flow of the second gas flowed through one or more of the orifices 330-336 to the center zone 42 and the edge zone 46 of the plasma processing chamber. In an alternative embodiment, the pair of valves 320 located along the gas passages 364, 366 can be replaced by a single, four-way valve.

In the second flow control section 315, the orifice 338 is arranged along the gas passage 359. The gas passage 359 is divided into gas passages 372, 374, which are in fluid communication with the first and second gas passages 364, 366, respectively. A pair of valves 320 is located in the gas passages 372, 374 to control flow of the second gas flowed through the orifice 338 to the first and/or second gas passages 364, 366. In an alternative embodiment, the pair of valves 320 located along the gas passages 372, 374 can be replaced by a single four-way valve.

The orifices 330-338 are included in the flow control section 300 to prevent pressure surges and flow instabilities in the gas flow when the gas distribution system 100 changes the gas flowed into the plasma processing chamber 12 from the first gas to the second gas, and vice versa.

In the embodiment shown in FIG. 4, the gas passage 242 of the first tuning gas source 218 (FIG. 3) is arranged to supply the first tuning gas to the first gas passage 324 and/or second gas passage 326 of the first flow control section 305 to adjust the first gas composition. The gas passage 244 of the second tuning gas source 219 (FIG. 3) is arranged to supply the second tuning gas to the first gas passage 364 and/or second gas passage 366 of the second flow control section 315 to adjust the second gas composition. The first and second tuning gases can be the same tuning gas or different tuning gases.

A flow control device 340, preferably an MFC, is arranged along the gas passage 242. Valves 320 are located along the gas passages 337, 339 to control flow of the first tuning gas into the gas passage 326, 324, respectively. In an alternative embodiment, the pair of valves 320 located along the gas passages 337, 339 can be replaced by a single, four-way valve.

A flow control device 340, preferably an MFC, is arranged along the gas passage 244. Valves 320 are located along the gas passages 376, 378 to control flow of the second tuning gas into the gas passages 366, 364, respectively. In an alternative embodiment, the pair of valves 320 located along the gas passages 376, 378 can be replaced by a single, four-way valve.

In the embodiment of the flow control section 300 shown in FIG. 4, the first flow control section 305 and the second flow control section 315 include the same components arranged in the same configuration. However, in other preferred embodiments of the gas distribution system 100, the first and second flow control sections 305, 315 can have different components and/or different configurations from each other. For example, the first and second flow control sections 305, 315 can include different numbers of orifices and/or orifices with different restriction sizes from each other. For example, the first and second flow control sections 305, 315 can include multiple tuning gases.

Figure 5:
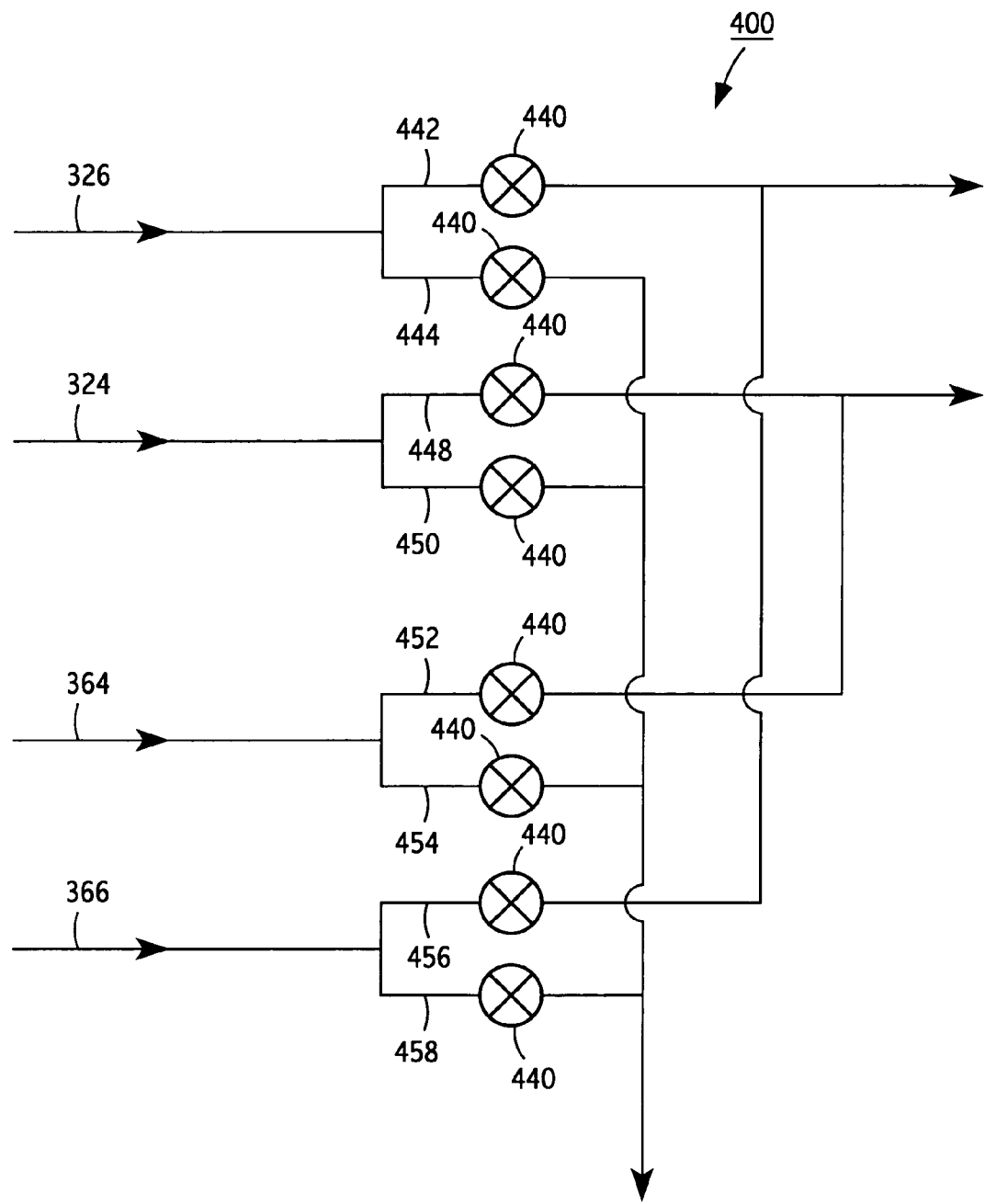
FIG. 5 depicts a first preferred embodiment of a gas switching section of the gas distribution system.

In the gas distribution system 100, the gas switching section 400 is in fluid communication with the flow control section 300, and with the interior of the vacuum chamber and the by-pass line to which the first and second gases are flowed. A first preferred embodiment of the gas switching section 400 is depicted in FIG. 5. The gas switching section 400 can alternately supply first and second gases to both the center zone 42 and the edge zone 46 of the plasma processing chamber 12. The gas switching section 400 is in fluid communication with the first gas passage 324 and the second gas passage 326 of the first flow control section 305, and with the first gas passage 364 and the second gas passage 366 of the second flow control section 315.

The first gas passage 324 of the first flow control section 305 is divided into gas passages 448, 450; the second gas passage 326 of the first flow control section 305 is divided into gas passages 442, 444; the first gas passage 364 of the second flow control section 315 is divided into gas passages 452, 454; and the second gas passage 366 of the second flow control section 315 is divided into gas passages 456, 458. In the embodiment, the gas passage 442 is in fluid communication with the edge zone 46 of the plasma chamber 12, the gas passage 448 is in fluid communication with the center zone 42 of the plasma processing chamber 12, and the gas passage 444 provides a by-pass line. The gas passage 456 is in fluid communication with the gas passage 442 to the edge zone 46. The gas passage 452 is in fluid communication with the gas passage 448 to the center zone 42. The gas passages 450, 454 and 458 are in fluid communication with the gas passage 444 to the by-pass line.

A valve 440 is arranged along each of the gas passages 442, 444, 448, 450, 452, 454, 456 and 458. The valves 440 can be selectively opened and closed, preferably under control of the controller 500, to supply the first or second gas to the chamber, while simultaneously diverting the other gas to the by-pass line.

For example, to supply the first gas to the center zone 42 and the edge zone 46 of the plasma processing chamber 12 and divert the second gas to the by-pass line, the valves 440 along the gas passages 442, 448 and 454, 458 are opened, while the valves 440 along the gas passages 444, 450 and 452, 456 are closed. To switch the gas flow so that the second gas is supplied to the center zone 42 and the edge zone 46 of the plasma processing chamber 12, while the first gas is diverted to the by-pass line, the valves 440 along the gas passages 444, 450 and 452, 456 are opened, while the valves 440 along the gas passages 442, 448 and 454, 458 are closed. In other words, a first group of valves 440 is opened and a second group of valves 440 is closed to supply the first gas to the plasma processing chamber 12, and then the same first group of valves is closed and the same second group of valves 440 is opened to change the gas flow to supply the second gas to the plasma processing chamber.

In the gas switching section 400, the valves 440 are fast-switching valves. As used herein, the term "fast-switching valve" means a valve that can be opened or closed within a short period of time, preferably less than about 100 ms, such as less than about 50 ms or less than 10 ms, after being actuated to open or close. A suitable "fast-switching valve" for use in the gas switching section 400 is the Swagelok® ALD diaphragm pneumatic valve, available from the Swagelok Company, located in Solon, Ohio.

The fast acting Swagelok ALD valves are pneumatically fired. The gas switching section 400 preferably includes a control system for controlling opening and closing of these valves. In an embodiment, the control system includes a fast acting pilot valve (solenoid valve) to collect a signal from the controller 500 and send pneumatic air to a fast switching valve. The fast switching valves acts as a slave to the fast acting pilot valve. The pilot valve can typically take less than about 5 ms, e.g., about 2 ms, and the fast switching valve can typically take less about 10 ms, e.g., about 6 ms or less, for a total of less than about 10 ms, such as about 8 ms from receiving the control signal until the fast switching valve is actuated. The actuation time of the fast switching valve can vary depending on factors including the length and size of the flow passage providing the pneumatic air, and the pneumatic supply pressure. The pneumatic supply pressure can be chosen, for example, such that the fast switching valves open and close at about the same speed, which can prevent momentary upstream pressure perturbations between valve pairs during opening and closing.

The pneumatic air supply system can have any suitable construction. In an embodiment, the supply system can include an air reservoir operable to maintain the pneumatic supply pressure within a selected range, e.g., from about 80 to 85 psig, during the full duration of valve actuation. The supply system can include an upstream check valve and a regulator to isolate the reservoir pressure from other system related drops in the pneumatic supply pressure. The reservoir volume can be selected based on the amount of pressure drop during fast switching valve actuation, and the amount of time to refill to the regulator set point pressure.

The gas switching section 400 can supply the first gas, e.g., to the interior of the vacuum chamber, while diverting the second gas to the by-pass line, and then, preferably under control of the controller 500, quickly switch these gas flows and supply the second gas to the vacuum chamber while diverting the first gas to the by-pass line. The amount of time that the first gas or second gas is supplied to the vacuum chamber before the gases are switched can be controlled by the controller 500. As explained above, the gas distribution system 100 can be used with a plasma processing chamber including a plasma confinement zone to replace a gas volume of about ½ liter to about 4 liters within a period of less than about 1 s, more preferably less than about 200 ms, to thereby stabilize the system.

The valves 440 of the gas switching system have a valve flow coefficient $C_v$, which characterizes the resistance to flow of the valve. The flow coefficient $C_v$ is specified in standard ANSI/ISA-S75.02 (1996), and can be determined by the test method described in SEMI (Semiconductor Equipment Industry) standard F32, entitled "Test Method for Determination of Flow Coefficient for High Purity Shutoff Valves." For a given valve 440, as the flow coefficient $C_v$ increases, there is a higher gas flow rate through the valve 440 for a given pressure drop across the valve 440, i.e., increasing $C_v$ makes the valve less restrictive to gas flow.

As described above, in the embodiment of the gas switching system 400 shown in FIG. 5, pairs of valves 440 are arranged in fluid communication with each of the gas passages 326, 324, 364 and 366. For each pair of valves 440, one valve 440 can be opened while the other valve 440 is closed to flow process gas into the processing chamber, and then the valves can be switched to divert gas flow to the by-pass line. It has been determined that for stable switching of the gas from the processing chamber to the by-pass line and vice versa, and to maintain gas momentum, the inlet pressure for each valve 440 of a pair of valves 440 is ideally constant. It has further been determined that the inlet pressure for each valve 440 of a pair of valves 440 of the gas switching system 400 can be maintained constant by tuning of the respective flow coefficients $C_v$ of the valves 440, such that the valves of each pair of valves have mismatched $C_v$ values. In addition, it has been determined that by maintaining a substantially constant, preferably constant, inlet pressure for each valve 440 of a pair of valves of the gas switching system 400, and substantially constant, or preferably constant, inlet pressure between multiple pairs of valves 440 supplying the same processing chamber outlet (center or edge zone), process shifts associated with the flow control section 300 of the gas distribution system 100 can be minimized, and preferably eliminated. For example, in a preferred embodiment, the inlet pressure for the valves 440 along gas passages 442 and 456 are approximately the same (when the flow to each of these valves is approximately equal), and the inlet pressure for the valves 440 along gas passages 448 and 452 are approximately the same (when the flow to each of these valves is approximately equal). This situation allows for smooth transitions when switching the gas flow between the flow control sections 305 and 315.

For example, a valve 440 can have a factory pre-set $C_v$ value, and can be mechanically adjusted (tuned) to change the pre-set $C_v$ value to a tuned value. For example, in an embodiment, the valve 440 can be mechanically adjusted to decrease the $C_v$ value. It is contemplated that other valve constructions can be mechanically adjusted to increase the $C_v$ value. According to one preferred embodiment of the gas switching system 400, the valves 440 arranged along the gas passages 442, 448, 452 and 456 (i.e., reference valves) in fluid communication with the processing chamber have a pre-set $C_v$ value, and the valves 440 arranged along the gas passages 444, 450, 454 and 458 (i.e., tuned valves) in fluid communication with the by-pass line have a tuned $C_v$ value. In a preferred embodiment, the pre-set $C_v$ values of the valves 440 arranged along the gas passages 442, 448, 452 and 456 have a tolerance of about +/−2% of flow as normal from the manufacturer, and about +/−1% of flow as ideal, and the tuned $C_v$ values of the valves 440 arranged along the gas passages 444, 450, 454 and 458 have a tolerance of about +/−2% of flow as normal from the manufacturer, and about +/−1% of flow as ideal. The pre-set and tuned $C_v$ values of the valve pairs are mismatched such that the inlet pressure for each valve 440 of a pair of valves 440 of the gas switching system 400 can be maintained constant during switching, and the inlet pressure for all pairs of valves 440 supplying the same processing chamber outlet can be maintained constant during switching between flow control sections 305 and 315 shown in FIG. 4. In one preferred embodiment, each of the reference valves arranged along the gas passages 442, 448, 452 and 456 can have the same pre-set $C_v$ value. In another preferred embodiment, the reference valves can have different pre-set $C_v$ values. In one preferred embodiment, each of the tuned valves arranged along the gas passages 444, 450, 454 and 458 can have the same tuned $C_v$ value. In another preferred embodiment, the tuned valves can have different tuned $C_v$ values. In a preferred embodiment, the conductance of each of the processing chamber outlets is sufficiently close such that each of the valves 440 arranged along the gas passages 442, 448, 452 and 456, which are in fluid communication with the processing chamber, can have the same pre-set $C_v$ values, and each of the valves 440 arranged along the gas passages 444, 450, 454 and 458, which are in fluid communication with the by-pass line, can have the same tuned $C_v$ value, thereby simplifying the tuning of the gas switching system.

Each pair of valves 440 can have the same or a different $C_v$ mismatch to provide a constant inlet pressure situation for both valves of each valve pair. For example, in the embodiment of the gas switching system 400 shown in FIG. 5, each valve pair can have a different $C_v$ mismatch. That is, in one embodiment, the difference between the high $C_v$ value and low $C_v$ value can be the same for each pair of valves. In another embodiment, the high and low $C_v$ values can be different for different pairs of valves, with the difference between the high and low $C_v$ values being the same for each pair of valves. In another embodiment, the difference between the high $C_v$ value and low $C_v$ value can be different for each of the pairs of valves.

As described above, in a preferred embodiment, the pairs of valves can include valves that have the same pre-set $C_v$ values. In another preferred embodiment, the pairs of valves can include valves that have different pre-set $C_v$ values. In such embodiment, one of the valves can be tuned to mismatch the $C_v$ values to achieve a constant inlet pressure for each valve of the pair of valves during switching.

Referring to the valve pair arranged along the gas passages 442 and 444, in one embodiment, the valve 440 arranged along the gas passage 442 in fluid communication with the processing chamber can have a nominal $C_v$ value. The valve 440 arranged along the gas passage 444 in fluid communication with the by-pass line can be tuned to decrease its $C_v$ value to thereby increase the inlet pressure for this valve to match that of the valve 440 arranged along the gas passage 442. For example, in one embodiment, the $C_v$ value of the valve 440 arranged along the gas passage 442 can be a pre-set value of about 0.3 while the valve arranged along the gas passage 444 can have a tuned value of about 0.15 such that the inlet pressure for each valve 440 of this valve pair can be maintained constant during switching. In cases where the pre-set $C_v$ value of a valve 440 is undesirably high, both valves 440 of a valve pair can be tuned to provide the desired $C_v$ mismatch. Preferably, there is viscous critical flow through the valve 440 along the gas passage 444 (and also through other valves in fluid communication with the by-pass line) to avoid backstreaming, i.e., gas diffusion across the valve in the direction opposite to the gas flow direction. For viscous critical flow through an aperture, a variation in the outlet pressure does not vary flow across the aperture. Typically, there is a relatively low pressure drop across the valves in fluid communication with the processing chamber.

In one preferred embodiment, the valves 440 along the gas passages 444 and 458 can have the same tuned $C_v$ value because both of these valves are in fluid communication with the same by-pass line (i.e., the same exhaust outlet) and the valves 440 along the gas passages 442 and 456 are in fluid communication with the same zone (i.e., the same processing chamber delivery outlet) and have the same preset $C_v$ value. This situation typically applies if the plumbing of the gas switching system 400 is sufficiently similar between these two circuits. For other gas switching systems in which these two circuits do not have sufficiently similar plumbing, the valves along the gas passages 444 and 458 can have different tuned $C_v$ values than each other. In the gas switching system 400 shown in FIG. 5, the valves along the gas passages 450 and 454 typically can have the same tuned $C_v$ value because these valves are in fluid communication with the same by-pass line and the valves arranged along gas passages 448, 452 are in fluid communication with the same zone of the processing chamber and have the same preset $C_v$ value.

Accordingly, in embodiments of the gas switching system 400, the $C_v$ mismatching of the valves 440 creates a condition where the inlet pressure between pairs of valves (e.g., the valves arranged along the gas passages 442, 444) is constant as a user switches the gas flow from one valve (e.g., the valve 440 arranged along gas passage 442) to the other valve (i.e., the valve arranged along gas passage 444) and then back again. Although tuning of the valves 440 arranged along the gas passages in fluid communication with the by-pass line is described above, in other embodiments, the valves 440 in fluid communication with the processing chamber (i.e., one or more of the valves 440 along the gas passages 442, 448, 452 and 456) can be tuned to create a constant inlet gas pressure situation. That is, in such embodiments, for each valve pair, either valve can be adjusted to create a constant inlet gas pressure situation. In addition, as each valve pair is mismatched, each tuned valve can have the same $C_v$ setting, or there can be two, three or four different $C_v$ settings for the different pairs of valves 440 shown in FIG. 5. The other valve of the valve pair that is not adjusted has the nominal or preset $C_v$ value, thereby providing four valves with the same nominal $C_v$ value in this embodiment.

An exemplary procedure for adjusting the flow coefficient of one or more preset valves to produce an approximately equal inlet pressure situation for valve pairs of the gas switching section is as follows. A test gas flow that falls within (e.g., at about the middle) of the plasma processing chamber's critical process gas flow operating range is selected. For example, the gas flow can be about 500 sccm argon. Using the first flow control section 305, for example, of the flow control section 300, the selected gas flow is flowed to the dual gas flow splitter at a desired weighting value to the center and edge zones. Using the gas switching section 400, all of the gas flow from the first flow control section 305 is flowed to the processing chamber through the valves along gas passage 442, 448 having factory pre-set $C_v$ values. The inlet gas pressure for these valves is measured, such as using one or more capacitive manometers. Using the gas switching section 400, all of the gas flow from the first flow control section 305 is then flowed to the bypass line through the valves 440 along gas passages 444, 450 also having factory pre-set $C_v$ values. The inlet gas pressure for each of these valves is measured. The valve inlet pressures for flow to the plasma processing chamber and flow to the bypass line are compared with respect to the measured values. Either the valves along the gas passage 442, 448 (to the processing chamber) or the valves 444, 450 (to the bypass) are adjusted to a lower $C_v$ value, depending on which valves had a lower measured inlet pressure. The selected valves are adjusted, the test gas is re-flowed and the inlet pressure is re-measured and compared to the inlet pressure of the other valve of the valve pair. This procedure can be repeated until the desired inlet pressure situation is achieved. The adjustment can be confirmed by switching the gas flow for various flow ranges and confirming that processing chamber pressure spikes or plasma dropout does not occur during the switching.

Figure 6:
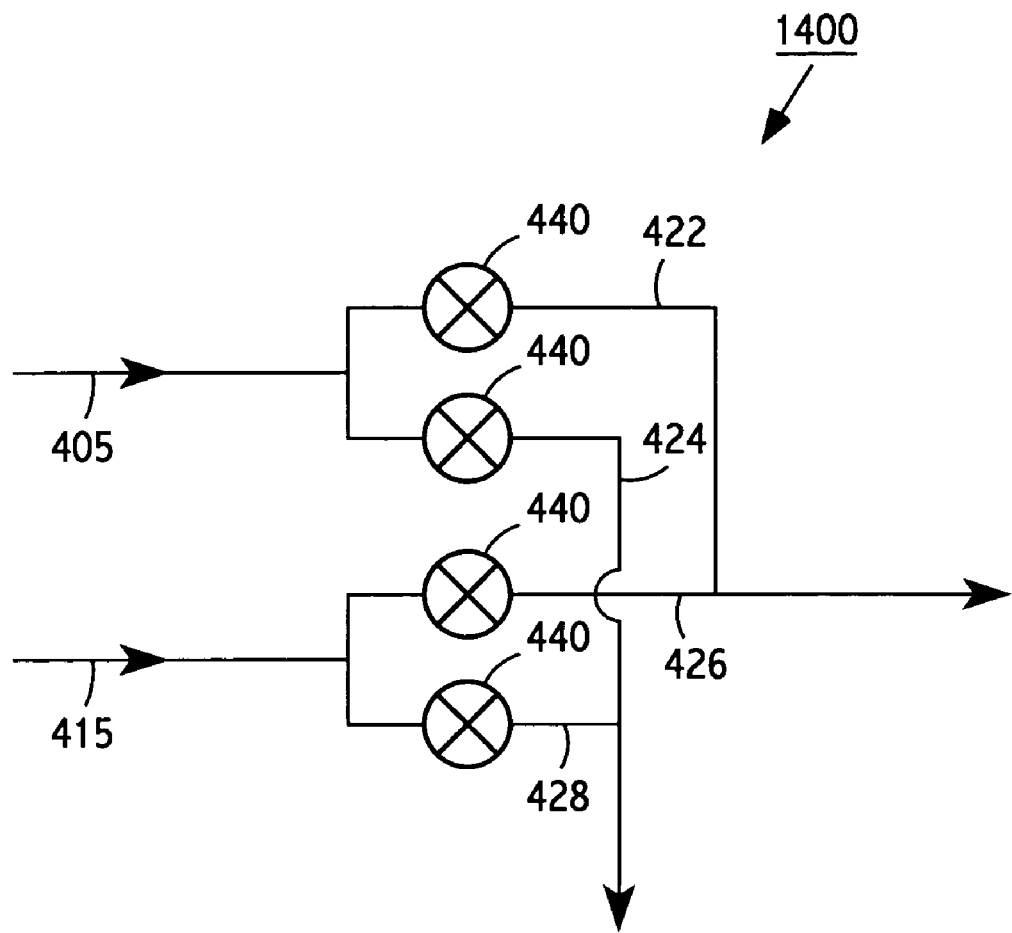
FIG. 6 depicts a second preferred embodiment of the gas switching section of the gas distribution system.

A gas switching section 1400 according to a second preferred embodiment is depicted in FIG. 6. In this embodiment, the gas switching section 1400 is in fluid communication with a first gas passage 405 and a second gas passage 415. The first and second gas passages 405, 415 can be, e.g., a first gas outlet and a second gas outlet, respectively, of a flow control section that, unlike the flow control section 300 shown in FIG. 4, does not include both center and edge zone gas outlets. The first gas passage 405 is divided into gas passages 422, 424, and the second gas passage 415 is divided into gas passages 426, 428. The gas passages 422 and 426 are in fluid communication with an interior of a vacuum chamber, and the gas passages 424 and 428 are in fluid communication with a by-pass line. A valve 440 is located along each of the gas passages 422, 424 and 426, 428.

For example, to supply the first gas to the vacuum chamber and simultaneously route the second gas to the by-pass line, the valves 440 along the fluid passages 422 and 428 are opened and the valves 440 along the gas passages 424 and 426 are closed. To switch the gas flows so that the second gas is supplied to the vacuum chamber and the first gas is diverted to the by-pass line, the valves 440 along the fluid passages 424 and 426 are opened and the valves 440 along the fluid passages 422 and 428 are closed.

In the embodiment of the gas switching system 1400 shown in FIG. 6, the valves along gas passages 422 and 426 lead to the same processing chamber outlet, and the valves along gas passages 424 and 428 lead to the same by-pass line. Typically, the valves arranged along gas passages 424 and 428 can have the same tuned (reduced) $C_v$ value, while the valves along gas passages 422 and 426 can have a nominal $C_v$ value. As described above, the pairs of valves along the gas passages 422, 424 and 426, 428 can have mismatched $C_v$ values such that the inlet pressure for each valve 440 of a pair of valves 440 of the gas switching system 400 can be maintained constant.

Preferred embodiments of the gas distribution system 100 can be used to supply different gas chemistries and/or flow rates to the plasma processing chamber 12 to perform various etching and/or deposition processes. For example, the gas distribution system 100 can supply process gases to a plasma processing chamber to etch features in a silicon oxide, such as an $SiO_2$ layer protected by an overlying mask, such as a UV resist mask. The $SiO_2$ layer can be formed on a semiconductor wafer, such as a silicon wafer, having a diameter of 200 mm or 300 mm. The features can be, e.g., vias and/or trenches. During such etching processes, it is desirable to deposit a polymer on portions of the mask to repair striations, e.g., cracks or fissures, in the mask (i.e., to fill the striations) so that features etched in the $SiO_2$ have their desired shape, e.g., vias have a round cross-section. If striations are not repaired, they can eventually reach the layer underlying the mask and in effect be transferred to that layer during etching. Also, a polymer can be deposited on the sidewalls of the features.

It has been determined, however, that the thickness of the polymer deposited on the sidewalls and the base of etched features affects the etch rate. In anisotropic etching processes, polymer deposited on the bottom of the feature is substantially removed during etching. However, if the polymer becomes too thick on the sidewalls and/or on the base, the etch rate of $SiO_2$ is decreased, and may be stopped completely. Polymer may also flake off of surfaces if it becomes too thick. Accordingly, the amount of time that the gas mixture for forming the polymer deposit on the mask and features is supplied into the plasma processing chamber is preferably controlled to thereby control the thickness of the polymer deposit formed on the $SiO_2$ layer, while also providing sufficient repair and protection of the mask. During etching of the $SiO_2$ layer, polymer is periodically removed from the mask. Accordingly, the polymer is preferably deposited on the mask between periods of etching of the $SiO_2$ layer to ensure that sufficient repair and protection of the mask is achieved.

The gas distribution system 100 can be used to supply process gas into a plasma processing chamber to etch $SiO_2$ protected by an overlying mask, e.g., a UV resist mask, with control of the thickness of polymer deposited on the features, and with repair and protection of the mask. The gas switching section of the gas distribution system 100 is operable to allow a first process gas used to etch the $SiO_2$ to be supplied into the plasma processing chamber for a first period of time while a second gas mixture used to form the polymer deposit is diverted to a by-pass line, and then to quickly switch the gas flows so that the second gas mixture is supplied into the plasma processing chamber to form the polymer deposit while the first gas mixture is supplied to the by-pass line. Preferably, the first gas mixture supplied to a plasma confinement zone of the plasma processing chamber is at least substantially replaced with the second gas mixture within a period of less than about 1 s, more preferably less than about 200 ms. The plasma confinement zone preferably has a volume of about ½ liter to about 4 liters.

The first gas mixture used to etch $SiO_2$ can contain, e.g., a fluorocarbon species, such as $C_4F_8$, $O_2$ and argon. The flow ratio of $C_4F_8/O_2$/argon can be, e.g., 20/10/500 sccm. The second gas mixture used to form a polymer deposit can contain, e.g., a fluorohydrocarbon species, such as $CH_3F$, and argon. The flow ratio of $CH_3F$/argon can be, e.g., 15/500 sccm. The second gas mixture can optionally also include $O_2$. For a capacitive-coupled plasma etch reactor for processing 200 mm or 300 mm wafers, the chamber pressure can be, e.g., 70-90 mTorr. The first gas mixture is preferably flowed into the plasma processing chamber for about 5 seconds to about 20 seconds each time it is introduced into the chamber (while the second gas is diverted to the by-pass line), and the second gas mixture is preferably flowed into the plasma processing chamber for about 1 second to about 3 seconds each time it is introduced into the chamber (while the first gas is diverted to the by-pass line). During etching of $SiO_2$ on a substrate, the length of the etching period and/or the polymer deposition period can be increased or decreased within the preferred time periods. The polymer deposit preferably reaches a maximum thickness of less than about 100 angstroms during the etching process, which typically lasts up to about 3 minutes. During etching, polymer can be deposited on the mask to repair striations and provide mask protection. Accordingly, the shape of the openings in the mask preferably can be maintained during the etching process.

The present invention has been described with reference to preferred embodiments. However, it will be readily apparent to those skilled in the art that it is possible to embody the invention in specific forms other than as described above without departing from the spirit of the invention. The preferred embodiments are illustrative and should not be considered restrictive in any way. The scope of the invention is given by the appended claims, rather than the preceding description, and all variations and equivalents which fall within the range of the claims are intended to be embraced therein.

What is claimed is:

1. A gas switching section for a gas distribution system for supplying gas to a plasma processing chamber including a gas distribution member having center and edge zones which are flow insulated from each other, the gas switching section comprising:

a first gas passage adapted to be in fluid communication with a first gas line and the edge zone of the gas distribution member of the plasma processing chamber; a second gas passage adapted to be in fluid communication with the first gas line and a by-pass line; a third gas passage adapted to be in fluid communication with a second gas line and the center zone of the gas distribution member; a fourth gas passage adapted to be in fluid communication with the second gas line and the by-pass line; a fifth gas passage adapted to be in fluid communication with a third gas line and the center zone; a sixth gas passage adapted to be in fluid communication with the third gas line and the by-pass line; a seventh gas passage adapted to be in fluid communication with a fourth gas line and the edge zone; an eighth gas passage adapted to be in fluid communication with the fourth gas line and the by-pass line;

first and second fast switching valves along the first and second gas passages respectively, the first fast switching valve operable to open and close the first gas passage and having a first flow coefficient, the second fast switching valve operable to open and close the second gas passage and having a second flow coefficient different than the first flow coefficient, wherein said first flow coefficient and said second flow coefficient define a desired first flow coefficient mismatch for the first and second fast switching valve pair such that, during switching, an inlet pressure of the first fast switching valve and an inlet pressure of the second fast switching valve are maintained substantially constant when gas flow is switched from the first gas passage to the second gas passage by closing the first fast switching valve and opening the second fast switching valve, or from the second gas passage to the first gas passage by closing the second fast switching valve and opening the first fast switching valve;

third and fourth fast switching valves along the third and fourth gas passages, respectively, the third fast switching valve operable to open and close the third gas passage and having a third flow coefficient, the fourth fast switching valve operable to open and close the fourth gas passage and having a fourth flow coefficient different than the third flow coefficient, wherein said third flow coefficient and said fourth flow coefficient define a desired second flow coefficient mismatch for the third and fourth fast switching valve pair such that, during switching, an inlet pressure of the third fast switching valve and an inlet pressure of the fourth fast switching valve are maintained substantially constant when gas flow is switched from the third gas passage to the fourth gas passage by closing the third fast switching valve and opening the fourth fast switching valve, or from the fourth gas passage to the third gas passage by closing the fourth fast switching valve and opening the third fast switching valve;

fifth and sixth fast switching valves along the fifth and sixth gas passages, respectively, the fifth fast switching valve operable to open and close the fifth gas passage and having a fifth flow coefficient, the sixth fast switching valve operable to open and close the sixth gas passage and having a sixth flow coefficient different than the fifth flow coefficient, wherein said fifth flow coefficient and said sixth flow coefficient define a desired third flow coefficient mismatch for the fifth and sixth fast switching valve pair such that, during switching, an inlet pressure of the fifth fast switching valve and an inlet pressure of the sixth fast switching valve are maintained substantially constant when gas flow is switched from the fifth gas passage to the sixth gas passage by closing the fifth fast switching valve and opening the sixth fast switching valve, or from the sixth gas passage to the fifth gas passage by closing the sixth fast switching valve and opening the fifth fast switching valve; and seventh and eighth fast switching valve along the seventh and eighth gas passages respectively, the seventh fast switching valve operable to open and close the seventh gas passage and having a seventh flow coefficient, the eighth fast switching valve operable to open and close the eighth gas passage and having an eighth flow coefficient different than the seventh flow coefficient, wherein said seventh flow coefficient and said eighth flow coefficient define a desired fourth flow coefficient mismatch for the seventh and eighth fast switching valve pair such that, during switching, an inlet pressure of the eighth fast switching valve and an inlet pressure of the seventh fast switching valve are maintained substantially constant when gas flow is switched from the seventh gas passage to the eighth gas passage by closing the seventh fast switching valve and opening the eighth fast switching valve, or from the eighth gas passage to the seventh gas passage by closing the eighth fast switching valve and opening the seventh fast switching valve.

2. The gas switching section of claim 1, wherein: the first, third, sixth and eighth fast switching valves are adapted to be actuated to open and the second, fourth, fifth and seventh fast switching valves are adapted to be actuated to close so as to supply a first process gas to the center and edge zones and divert a second process gas to the by-pass line; and the second, fourth, fifth and seventh fast switching valves are adapted to be actuated to open and the first, third, sixth and eighth fast switching valves are adapted to be actuated to close so as to supply the second process gas to the center and edge zones and divert the first process gas to the by-pass line.

3. A plasma processing apparatus, comprising: a plasma processing chamber including a showerhead electrode assembly having center and edge zones which are flow insulated from each other; and the gas switching section according to claim 2 in fluid communication with the center and edge zones of the showerhead electrode assembly.

4. The plasma processing apparatus of claim 3, further comprising a control system operable to control the opening and closing of the first, second, third and fourth fast switching valves.

5. The plasma processing apparatus of claim 4, further comprising a flow control section including the first gas line in fluid communication with the first and second gas passages, the second gas line in fluid communication with the third and fourth gas passages, the third gas line in fluid communication with the fifth and sixth gas passages, and the fourth gas line in fluid communication with the seventh and eighth gas passages.

6. The plasma processing apparatus of claim 5, further comprising a gas supply section in fluid communication with the flow control section.

7. The plasma processing apparatus of claim 3, wherein: the plasma processing chamber has an interior volume of about ½ liter to about 4 liters; and the gas distribution system is operable to substantially replace the first process gas or the second process gas in a plasma confinement zone of the plasma processing chamber with the other of the first process gas or second process gas within a period of less than about 1 s.

8. The gas switching section of claim 1, wherein the first, third, fifth and seventh flow coefficients are substantially equal to each other, and the second, fourth, sixth and eighth flow coefficients are substantially equal to each other.

9. The gas switching section of claim 1, wherein a difference between the first and second flow coefficients is substantially equal to a difference between the third and fourth flow coefficients, the fifth and sixth flow coefficients and the seventh and eighth flow coefficients.

10. The gas switching section of claim 1, wherein: the inlet pressure of the first fast switching valve is approximately equal to the inlet pressure of the seventh fast switching valve when the flow of gas to each of the first and seventh fast switching valves is approximately equal; and the inlet pressure of the third fast switching valve is approximately equal to the inlet pressure of the fifth fast switching valve when the flow of gas to each of the third and fifth fast switching valves is approximately equal.

* * * * *